United States Patent
Ko et al.

(10) Patent No.: US 8,409,993 B2
(45) Date of Patent: Apr. 2, 2013

(54) METHOD AND SYSTEM FOR CONTROLLING COPPER CHEMICAL MECHANICAL POLISH UNIFORMITY

(75) Inventors: Francis Ko, Taichung (TW); Chun-Hsien Lin, Hsinchu (TW); Jean Wang, Hsinchu (TW); Chih-Wei Lai, Hsinchu (TW); Ping-Hsu Chen, Hsinchu (TW); Henry Lo, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 351 days.

(21) Appl. No.: 11/810,720

(22) Filed: Jun. 7, 2007

(65) Prior Publication Data
US 2008/0305563 A1 Dec. 11, 2008

(51) Int. Cl.
*H01L 21/302* (2006.01)
(52) U.S. Cl. .................. 438/692; 257/E21.304

(58) Field of Classification Search .................. 438/692; 257/E21.219
See application file for complete search history.

(56) References Cited

U.S. PATENT DOCUMENTS

| 6,821,895 B2 | 11/2004 | Lin et al. |
| 6,929,533 B2 | 8/2005 | Chang |
| 2004/0166686 A1* | 8/2004 | Lin et al. ........ 438/692 |
| 2005/0208876 A1* | 9/2005 | Chen et al. ........ 451/5 |

* cited by examiner

*Primary Examiner* — Tony Tran
(74) *Attorney, Agent, or Firm* — Slater & Matsil, L.L.P.

(57) ABSTRACT

A system and method for controlling resistivity uniformity in a Copper trench structure by controlling the CMP process is provided. A preferred embodiment comprises a system and a method in which a plurality of CMP process recipes may be created comprising at least a slurry arm position. A set of metrological data for at least one layer of the semiconductor substrate may be estimated, and an optimum CMP process recipe may be selected based on the set of metrological data. The optimum CMP process recipe may be implemented on the semiconductor substrate.

9 Claims, 2 Drawing Sheets

METHOD AND SYSTEM FOR CONTROLLING COPPER CHEMICAL MECHANICAL POLISH UNIFORMITY

TECHNICAL FIELD

The present invention relates generally to chemical mechanical polishing (CMP), and more particularly to a system and method for controlling resistivity uniformity in a copper trench structure by controlling the CMP process.

BACKGROUND

Chemical mechanical polishing is increasingly being used as a planarizing process for semiconductor device layers, especially for devices having multi-level design and smaller semiconductor fabrication processes, for example, below about 0.25 micron. CMP planarization is typically used several different times in the manufacture of a multi-level semiconductor device, including planarizing levels of a device containing both dielectric and metal portions to achieve global planarization for subsequent processing of overlying levels.

A limitation of CMP is its high dependency on pattern density, which results in a non-uniform planarization of large and small features. Under polish, over polish and non-uniform polish affect the resistivity of a damascene-formed trench metal system.

Another prior art method includes using a multi-zone head to control Cu CMP within wafer uniformity. After Cu deposition on a wafer, the wafer may be loaded into a CMP apparatus wherein the wafer may be subjected to the CMP process in steps using different platens within the CMP apparatus. The multi-zone head allows for differing pressures across the CMP head. While multi-zone processing may produce satisfactory results in a dielectric layer CMP process, multi-zone processing may not produce satisfactory results in a Cu CMP process. FIG. 1 shows the differences between a multi-zone head and a single zone head. A disadvantage of this prior art method is that the within wafer uniformity for Cu structure resistivity may not be controlled within necessary limits.

Another prior art method includes taking measurements of a sample wafer to determine the post etch uniformity. The slurry feed arm is adjusted to a subsequent dispensing position such that the slurry is dispensed over the polishing pad at a position that compensates for previous process non-uniformities and provides for a more uniform polished layer. A disadvantage of this prior art method is that the sample measurements may not be indicative of the wafer run being processed. Another disadvantage is the cost of delay while measurements are taken and interpreted.

SUMMARY OF THE INVENTION

These and other problems are generally solved or circumvented, and technical advantages are generally achieved, by the illustrative embodiments of the present invention. In an illustrative embodiment, a plurality of CMP process recipes may be created comprising at least a slurry arm position. A set of metrological data for at least one layer of the semiconductor substrate may be estimated, and an optimum CMP process recipe may be selected based on the set of metrological data. The optimum CMP process recipe may be implemented on the semiconductor substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a "trench etch/Cu fill" CMP process. The invention may also be applied, however, to other CMP processes.

A plurality of CMP process recipes may be created comprising at least a slurry arm position. The slurry arm position affects the uniformity of layer removal in the CMP process. A set of metrological data for at least one layer of the semiconductor substrate may be estimated. The estimation may be a form of virtual metrology. Data from equipment sensors and actual metrology (sites physically measured) may be combined to create an estimated data set for a wafer run. Based on the estimated data set, a uniformity profile for the wafer run may be predicted. An optimum CMP process recipe may be selected based on the predicted uniformity. The optimum CMP process recipe may be implemented on the semiconductor substrate.

One illustrative embodiment presents a process wherein sample cites are measured from a wafer run at a post trench etch inspection step. A wafer run may be a batch, a lot, or a single wafer. Machine parameters may also be gathered from the etch equipment during the trench etch process. An example of equipment parameters may be temperature and radio frequency (RF) signals, among other parameters. Other equipment parameters and other metrological data from the wafer run may also be gathered. From a set of this data, wafer run metrology data is estimated. The within wafer uniformity of the wafer run is then predicted and matched against a CMP process recipe. A portion of the CMP process recipe is the slurry arm position program. The slurry arm position program may compensate for the non-uniformities manifested on the wafer run following the trench etch step. The CMP process recipe may have been defined and created previously. The wafer is then processed through the CMP apparatus using the selected slurry arm position program. Using the methods of the illustrative embodiments, the within wafer uniformity following the CMP process may be improved.

Figure 1:
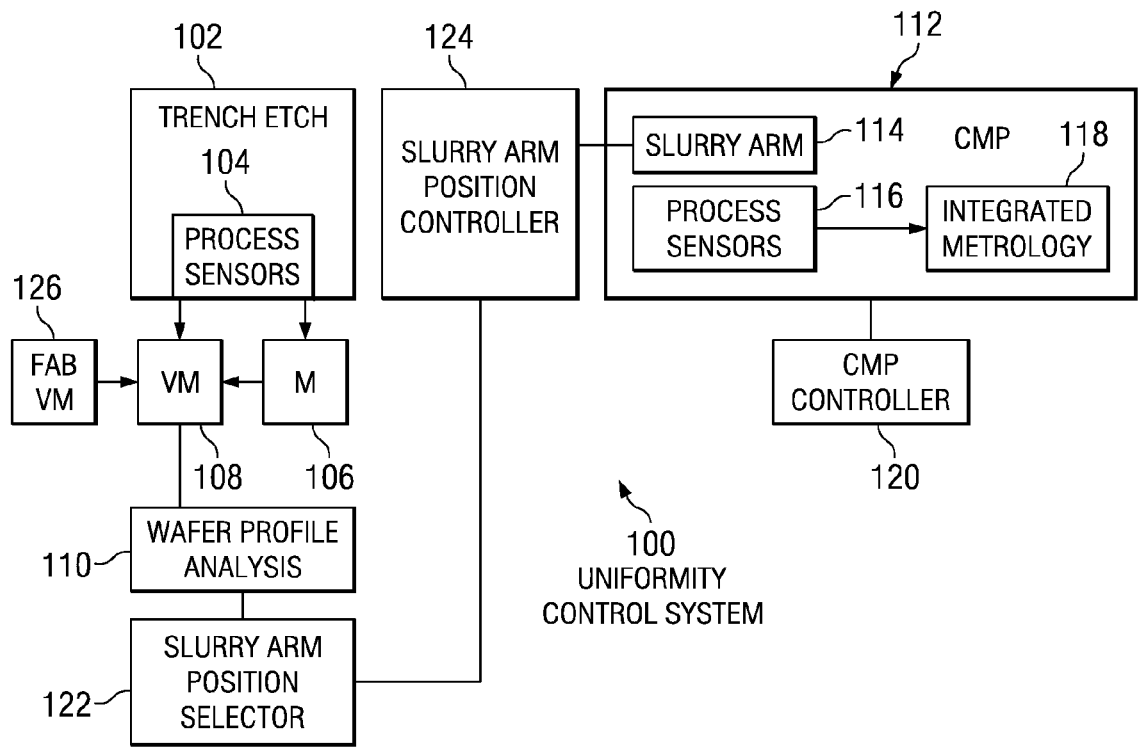
FIG. 1 is a block diagram of various components of an illustrative embodiment for controlling Cu CMP uniformity.

With reference now to FIG. 1, there is shown a block diagram of various components of an illustrative embodiment for controlling CMP process uniformity. Trench etch equipment 102 is typically a plasma reactor such as a Lam Flex or TEL SCCM in which several parameters may be monitored by process sensors 104 such as broadband radio-frequency (RF) and broadband optical signals. Metrology equipment 106 is used to measure film thicknesses and characteristics such as roughness.

Virtual metrology processor 108 is a system that uses machine parameters, such as those monitored by process sensors 104, and actual measurements from metrology equipment 106 to estimate metrology measurements for each wafer. Virtual metrology processor 108 may process data from multiple advanced sensors, including broadband radio-frequency (RF) and broadband optical sensors. Virtual metrology processor 108 may also have connectivity to other virtual metrology systems 126 within the wafer fabrication facility. Wafer profile analyzer 110 may use the data from virtual metrology processor 108 and may use data from actual metrology 106 to predict the uniformity profile of the processed wafers.

Chemical mechanical polish (CMP) 112 may be a multi-platen CMP machine equipped with a data processor, for example Applied Materials model Reflexion. CMP 112 includes an adjustable slurry arm 114. Adjustable slurry arm 114 may be an integral part of CMP 112, or CMP 112 may have been modified to incorporate slurry arm 114. CMP 112 may include process sensors 116 and/or an integrated metrology system 118. CMP 112 may be controlled by CMP controller 120.

Using the predicted wafer profiles of the processed wafers from wafer profile analyzer 110, slurry arm position selector 122 selects the optimum slurry arm position for improved post CMP processing uniformity. The slurry arm position selector 122 may be operated manually by an operator or automatically. Slurry arm position selector 122 may alternatively be a program run on a data processing system that may or may not be a stand alone computer. A computer is a programmable usually electronic device that can store, retrieve, and process data. Information from an integrated metrology system 118 may also feed into slurry arm position selector 122 either real time or statistically. Integrated metrology may be real time or near real time film thickness measurements. Slurry arm position controller 122 may then change the position of the slurry arm 114 to a position predetermined to optimize wafer run film uniformity. Slurry arm position controller 124 may be a manual device or may be an automated device. Slurry arm position controller 124 may or may not be incorporated into CMP controller 120. Some or all of the components of uniformity control system 100 incorporate a data processor or may couple with a distributed data processing network such as network 202 of FIG. 2.

Figure 2:
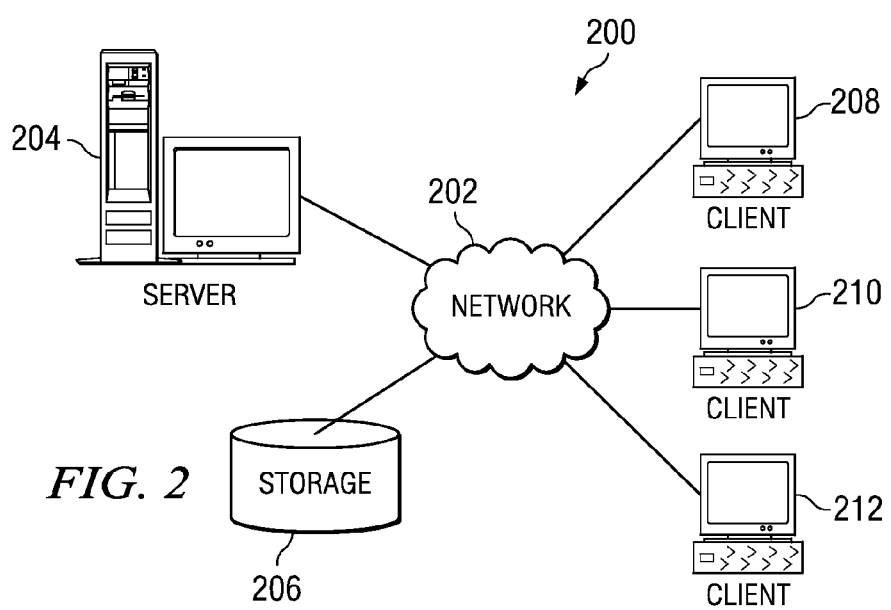
FIG. 2 is a pictorial representation of a distributed data processing system in which aspects of an illustrative embodiment may be implemented.

FIG. 2 is a pictorial representation of a distributed data processing system on which some aspect of the illustrative embodiments may be implemented. Network data processing system 200 is a network of computers in which the present invention may be implemented. Network data processing system 200 contains a network 202, which is the medium used to provide communications links between various devices and computers connected together within network data processing system 200. Network 202 may include connections, such as wire, wireless communication links, or fiber optic cables.

In the depicted example, a server 204 is connected to network 202 along with storage unit 206. In addition, clients 208, 210, and 212 also are connected to network 202. Clients 208, 210 and 212 may be semiconductor process equipment such as CMP 112; trench etcher 102; metrology equipment such as a MetaPulse, which is a product of Rudolph technologies, Inc.; or other equipment. Network 202 may include permanent connections, such as wire or fiber optic cables, or temporary connections made through telephone connections. The communications network 202 also can include other public and/or private wide area networks, local area networks, wireless networks, data communication networks or connections, intranets, routers, satellite links, microwave links, cellular or telephone networks, radio links, fiber optic transmission lines, ISDN lines, T1 lines, DSL, etc. In some embodiments, a user device may be connected directly to a server 204 without departing from the scope of the present invention. Moreover, as used herein, communications include those enabled by wired or wireless technology.

Clients 208, 210, and 212 may be, for example, personal computers, portable computers, mobile or fixed user stations, workstations, network terminals or servers, cellular telephones, kiosks, dumb terminals, personal digital assistants, two-way pagers, smart phones, information appliances, or network computers. For purposes of this application, a network computer is any computer, coupled to a network, which receives a program or other application from another computer coupled to the network.

In the depicted example, server 204 is an SMP system that provides data, such as boot files, operating system images, and applications to clients 208-212. Clients 208, 210, and 212 are clients to server 204. Network data processing system 200 may include additional servers, clients, and other devices not shown. In the depicted example, network data processing system 200 is the Internet with network 202 representing a worldwide collection of networks and gateways that use the TCP/IP suite of protocols to communicate with one another. At the heart of the Internet is a backbone of high-speed data communication lines between major nodes or host computers, consisting of thousands of commercial, government, educational and other computer systems that route data and messages. Of course, network data processing system 200 also may be implemented as a number of different types of networks, such as, for example, an intranet, a local area network (LAN), or a wide area network (WAN). FIG. 2 is intended as an example, and not as an architectural limitation for the present invention.

Figure 3:
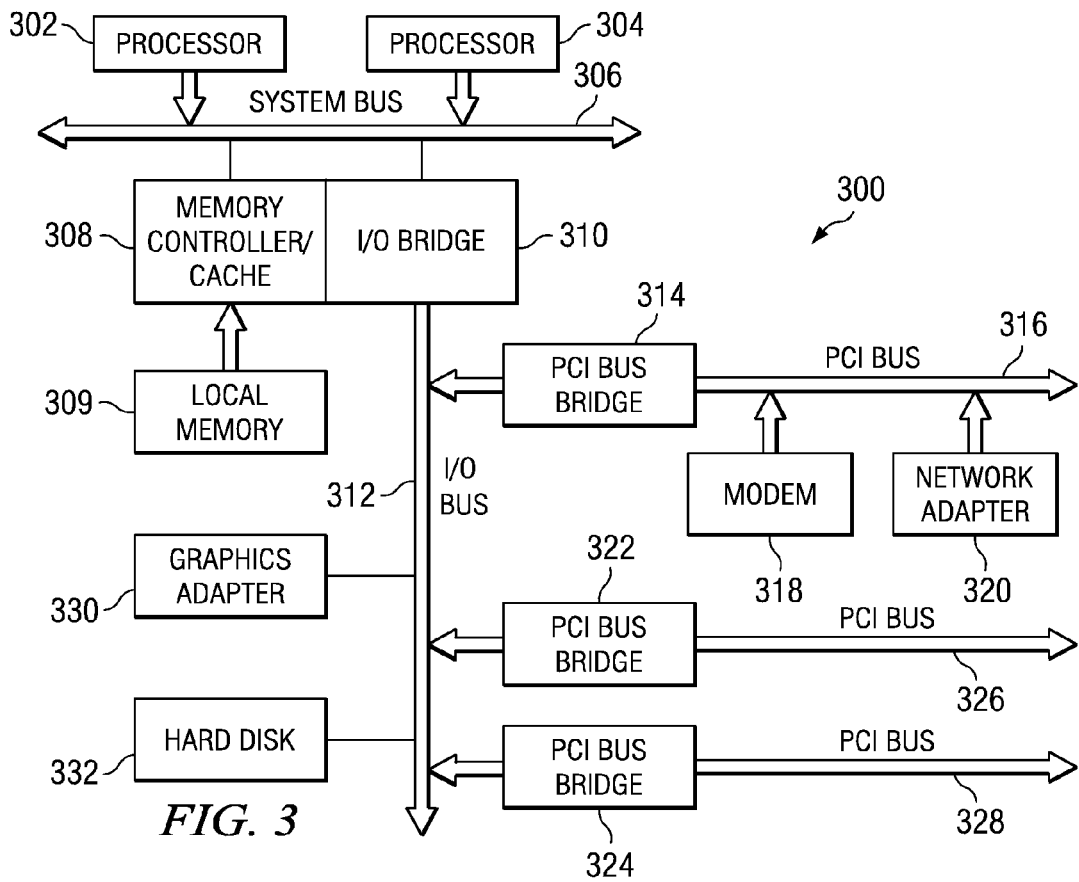
FIG. 3 is a more detailed block diagram of an SMP data processing system which may be implemented as either the server or client computer system depicted by FIG. 1.

FIG. 3 is a more detailed block diagram of an SMP data processing system that may be implemented as either the server or client computer system depicted in FIG. 2. Data processing system 300 is a symmetric multiprocessor (SMP) system including a plurality of processors 302 and 304 connected to system bus 306. Also connected to system bus 306 is memory controller/cache 308, which provides an interface to local memory 309. I/O bus bridge 310 is connected to system bus 306 and provides an interface to I/O bus 312. Memory controller/cache 308 and I/O bus bridge 310 may be integrated as depicted.

Peripheral component interconnect (PCI) bus bridge 314 connected to I/O bus 312 provides an interface to PCI local bus 316. A number of modems may be connected to PCI bus 316. Typical PCI bus implementations will support four PCI expansion slots or add-in connectors. Communications links to network computers in FIG. 2 may be provided through modem 318 and network adapter 320 connected to PCI local bus 316 through add-in boards.

Additional PCI bus bridges 322 and 324 provide interfaces for additional PCI buses 326 and 328, from which additional modems or network adapters may be supported. In this manner, data processing system 300 allows connections to multiple network computers. A memory-mapped graphics adapter 330 and hard disk 332 may also be connected to I/O bus 312 as depicted, either directly or indirectly.

Those of ordinary skill in the art will appreciate that the hardware depicted in FIG. 3 may vary. For example, other peripheral devices, such as optical disk drives and the like, also may be used in addition to or in place of the hardware depicted. The depicted example is not meant to imply architectural limitations with respect to the present invention.

The data processing system depicted in FIG. 3 may be, for example, an IBM RISC/System 6000 system, a product of International Business Machines Corporation in Armonk, N.Y., running the Advanced Interactive Executive (AIX) operating system.

Figure 4:
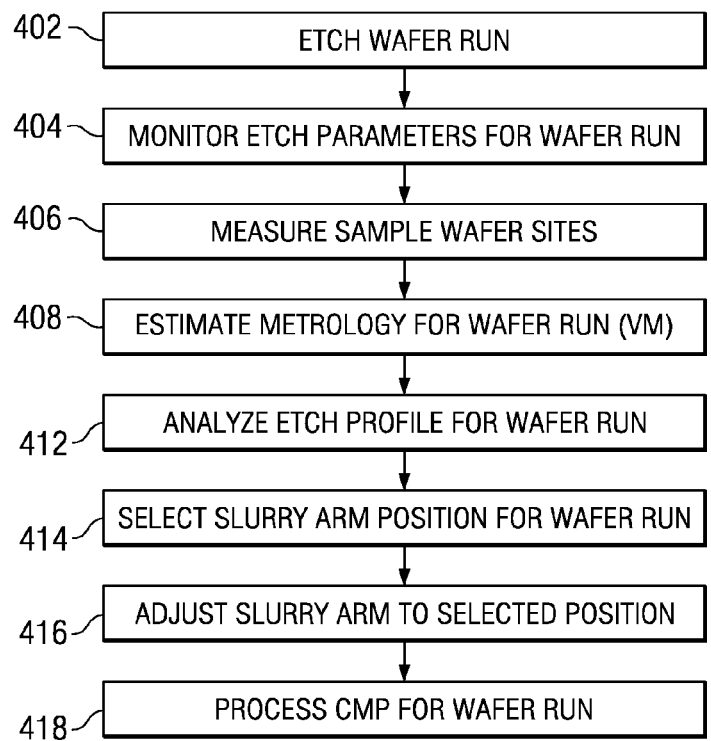
FIG. 4 is a flow chart depicting one illustrative embodiment for controlling Cu CMP uniformity.

FIG. 4 is a flow chart depicting a method for controlling Cu CMP uniformity. The wafer run begins the etch process (step 402). A wafer run may be a batch, lot or an individual wafer. As the wafer run is being etched, the etcher senses etch parameters, such as an optical signal (step 404). Following the etch process, sample wafer sites are measured by metrology equipment (step 406). At least the information from the etch sensors and the sample wafer sites are input into a virtual metrology system (step 408). Other information may be available to the virtual metrology system, for example, previous deposition and/or patterning information about the wafer run, may be gathered in step 408. The VM system then estimates the metrology for the wafer run sites that are not actually measured in step 406. An estimated etch profile for the wafer run is determined (412).

Next, based on the estimated etch profile for the wafer run, a slurry arm position is selected (step 414). The selected slurry arm position is actuated (step 416). The actuation may be automatic. Automatic means an automatically controlled operation by a mechanical or electronic device that takes the place of human labor. The wafer run is processed through the CMP (step 418). Although the present invention and its advantages have been described in detail, it should be understood that various changes, substitutions, and alterations can be made herein without departing from the spirit and scope of the invention as defined by the appended claims. For example, many of the features and functions discussed above can be implemented in software, hardware, or firmware, or a combination thereof. As another example, it will be readily understood by those skilled in the art that the level of automation of each step may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, the method comprising:
   providing an automated CMP process tool;
   creating a plurality of CMP process recipes, comprising at least a slurry arm position, for use in performing CMP processes on a semiconductor substrate using the automated CMP process tool;
   using previously collected metrological data including metrological data from prior etch processes performed on the semiconductor substrate and using metrological data measured on the semiconductor substrate following the prior etch processes, using a computer to estimate a set of metrological data to be expected for a wafer profile obtained by a CMP process yet to be performed using a slurry arm in the automated CMP process tool for at least one layer of the semiconductor substrate;
   subsequently, selecting a particular CMP process recipe based on the estimated set of metrological data to be expected;
   thereafter, using the computer, predicting a uniformity profile of the at least one layer that will result from performing the selected CMP process recipe using the automated CMP process tool on the semiconductor substrate based on the estimated set of metrological data; and
   subsequently, implementing the selected CMP process recipe and performing the CMP on the semiconductor substrate using the automated CMP process tool;
   wherein the uniformity profile is predicted for Cu resistivity by calculations comprising at least an estimated trench critical dimension and an estimated trench depth.

2. The method of claim 1, wherein the plurality of CMP process recipes comprise at least a first CMP process recipe with a first slurry arm position and a second CMP process recipe with a second slurry arm position.

3. The method of claim 1, wherein the uniformity profile is at least one of a set of criteria used in selecting a CMP process recipe.

4. The method of claim 3, wherein the set of metrological data includes integrated metrology data from a CMP controller.

5. The method of claim 1, wherein the set of metrological data is estimated from machine parameters, actual metrology measurements, or a combination of machine parameters and actual metrology measurements.

6. The method of claim 1, wherein the selection of the CMP process recipe is automated.

7. The method of claim 1, wherein the implementation of the selected CMP process recipe is automated.

8. The method of claim 1, wherein the implementation of the selected CMP process recipe is controlled by a CMP controller.

9. A method of manufacturing a semiconductor device, the method comprising:
   providing an automated CMP process tool;
   creating a plurality of CMP process recipes, comprising at least a slurry arm position, for use in performing CMP processes on a semiconductor substrate using the automated CMP process tool;
   using previously collected metrological data including metrological data from prior etch processes performed on the semiconductor substrate and using metrological data measured on the semiconductor substrate following the prior etch processes, using a computer to estimate a set of metrological data to be expected for a wafer profile obtained by a CMP process yet to be performed using a slurry arm in the automated CMP process tool for at least one layer of the semiconductor substrate;
   thereafter, selecting a particular CMP process recipe based on the estimated set of metrological data to be expected;
   subsequently, using the computer, predicting a uniformity profile of the at least one layer that will result from performing the selected CMP process recipe using the automated CMP process tool on the semiconductor substrate based on the estimated set of metrological data, wherein the uniformity profile is predicted for Cu resistivity by calculations comprising at least an estimated trench critical dimension and an estimated trench depth; and subsequently implementing the selected CMP process recipe by performing the CMP process on the semiconductor substrate using the automated CMP process tool.

\* \* \* \* \*